US008455373B2

(12) United States Patent
Cho et al.

(10) Patent No.: US 8,455,373 B2
(45) Date of Patent: Jun. 4, 2013

(54) INK-JET PRINT INK AND ORGANIC THIN FILM TRANSISTOR USING THEREOF

(75) Inventors: Kil Won Cho, Pohang-si (KR); Hwa Sung Lee, Pohang-si (KR); Ji Hwang Lee, Pohang-si (KR); Wi Hyoung Lee, Gyeongju-si (KR); Jung Ah Lim, Goyang-si (KR); Yeong Don Park, Pohang-si (KR)

(73) Assignee: Postech Academy-Industry Foundation, Pohang-si, Gyungbuk (KR)

( * ) Notice: Subject to any disclaimer, the term of this patent is extended or adjusted under 35 U.S.C. 154(b) by 0 days.

(21) Appl. No.: 13/002,459

(22) PCT Filed: Jul. 3, 2008

(86) PCT No.: PCT/KR2008/003946
§ 371 (c)(1),
(2), (4) Date: Apr. 7, 2011

(87) PCT Pub. No.: WO2010/002048
PCT Pub. Date: Jan. 7, 2010

(65) Prior Publication Data
US 2011/0180787 A1    Jul. 28, 2011

(30) Foreign Application Priority Data
Jul. 3, 2008 (KR) ........................ 10-2008-0064335

(51) Int. Cl.
*H01L 21/31* (2006.01)
*H01L 21/469* (2006.01)

(52) U.S. Cl.
USPC ............ 438/780; 438/99; 438/149; 438/150; 438/151; 438/781; 427/384; 427/385.5

(58) Field of Classification Search
USPC ............ 438/99, 149–151, 780–781; 427/384, 427/385.5
See application file for complete search history.

(56) References Cited

U.S. PATENT DOCUMENTS 7,842,942 B2 * 11/2010 Brown et al. .............. 257/40
2007/0184574 A1 * 8/2007 Ohno et al. ................. 438/99

FOREIGN PATENT DOCUMENTS

| KR | 10-2000-0062886 | 10/2000 |
| KR | 10-2008-0052080 | 6/2008 |
| WO | WO 2005/083814 | 9/2005 |
| WO | WO 2005/112145 | 11/2005 |

OTHER PUBLICATIONS

International Search Report, International Application No. PCT/KR2008/003946.
Lim, J.A., et al., "Ink-Jet Printing of Self-Aligned Soluble-Pentacene Crystals for High-Performance Organic Field-Effect Transistors," Proc. of SPIE, vol. 6658, 2007, pp. 1-8.

* cited by examiner

Primary Examiner — Bac Au
(74) Attorney, Agent, or Firm — Steptoe & Johnson LLP (57) ABSTRACT

The present invention provides ink-jet printing ink for organic semiconductors, and, more particularly, provides ink-jet printing ink for organic semiconductors, which can be used to form a uniform crystalline thin film. The ink-jet printing ink of the present invention includes a mixed solvent composed of a first solvent and a second solvent having a higher boiling point and lower surface tension than the first solvent, thus forming a uniform crystalline thin film in a volatilization process. Further, the present invention provides a circular organic thin film transistor having a high field-effect mobility of about 0.12 $cm^2V^{-1}S^{-1}$.

9 Claims, 6 Drawing Sheets

INK-JET PRINT INK AND ORGANIC THIN FILM TRANSISTOR USING THEREOF

CLAIM OF PRIORITY

This application claims priority under 35 USC 371 to International Application No. PCT/KR2008/003946, filed on Jul. 3, 2008, which claims priority to Korean Patent Application No. 10-2008-0064335, filed Jul. 3, 2008, each of which is incorporated by reference in its entirety.

TECHNICAL FIELD

The present invention relates to ink-jet printing ink for organic semiconductors, and, more particularly, to ink-jet printing ink for organic semiconductors, which can be used to form a uniform crystalline thin film.

BACKGROUND ART

Organic thin film transistors, which are drive elements for next-generation displays, are being researched actively. Organic thin film transistors (OTFTs), which are prepared using an organic film instead of a silicon film as a semiconductor layer, are classified into low-molecular organic thin film transistors, such as oligothiophene, pentacene and the like, and high-molecular organic thin film transistors, such as polythiophenes and the like, according to the material used for the organic film.

An organic electroluminescence display, which uses such organic thin film transistors as a switching device, is configured such that a plurality of pixels is arranged on a substrate in a matrix form in which each pixel includes two organic thin film transistors, for example, a switching organic thin film transistor and a driving organic thin film transistor, a capacitor, and an organic light emitting device composed of an organic film interposed between upper and lower electrodes.

Generally, a flexible organic electroluminescence display uses a flexible substrate, and the flexible substrate includes a plastic substrate. Since the plastic substrate has very low thermal stability, it is required to manufacture an organic electroluminescence display through a low-temperature process.

Therefore, since organic thin film transistors, each of which uses an organic film as a semiconductor layer, can be used in a low-temperature process, they are attracting considerable attention as a switching device for a flexible organic electroluminescence display.

Korean Unexamined Patent Application Publication No. 2004-0028010 discloses a pentacene thin film transistor which can shorten a thin film deposition time and improve hole mobility. Further, Korean Unexamined Patent Application Publication No. 2004-0084427 discloses an organic thin film transistor which can improve the electric performance of transistors and a method of manufacturing the same. Furthermore, Japanese Unexamined Patent Application Publication No. 2003-92410 discloses an organic thin film transistor which can improve carrier mobility and ON/OFF current ratio because its channel region is composed of organic compounds having radicals.

However, since the above methods of manufacturing an organic thin film transistor are disadvantageous in that the manufacturing cost is high, methods of manufacturing an organic thin film transistor at low cost has been required. For this reason, ink-jet printing technologies have attracted considerable attention as direct patterning methods required to manufacture organic electronic devices, such as organic light emitting diodes (OLEDs), organic field-effect transistors (OFETs), organic solar cells (OSCs), radio-frequency identifications (RFIDs) and the like, at low cost.

International Patent Publication No. 1999-39373 (WO 1999/39373) discloses a method of forming patterns on a substrate using ink-jet printing, in which an organic material, such as an organic semiconductor, dissolved in a solvent, such as chloroform, is deposited on the substrate, and then the solvent is volatilized to leave the organic material on the substrate.

However, the organic semiconductor layer formed using ink-jet printing is problematic in that it has low performance compared to organic semiconductor layers formed using spin coating or deposition because it is formed on the surface thereof with nonuniform morphologies and has low crystallinity.

In order to solve the above problem, novel organic semiconductor materials, such as poly(alkylthiophene) precursors, oligothiophene precursors, pentacene precursors and the like, are being developed, and methods of improving printing factors, such as the kinds of solvents for organic semiconductors, the surface wettability of a substrate, the concentration of a solution and the like, are being researched (M. Plotner, T. Wegener, S. Richter, W. J. Fischer, Synthe. Met. 2004, 147, 299., S. K. Volkman, S. Moleda, B. Mattix, P. C. Chang, V. Subramanian, Mater. Res. Soc. Symp. Proc. 2003. 771, 391., P. C. Chang, S. E. Molesa, A. R. Murphy, J. M. J. Frechet, V. Subramanian, IEEE Trans. Electron Devices 2006, 53, 594).

However, there are also unsolvable problems in that it is difficult to form uniform morphologies due to the coffee stain effect occurring during a process of drying a solvent and in that crystallinity cannot be exhibited even though uniform morphologies are formed.

Therefore, methods of controlling a drying process in order to form a uniform organic semiconductor layer after the drying process are continuously required. In particular, in the case of low molecular organic semiconductors, methods of manufacturing an organic semiconductor layer having crystallinity after the drying process are also required continuously.

DISCLOSURE

Technical Problem

Accordingly, an object of the present invention is to provide an ink-jet printing method of forming a uniform organic semiconductor layer after drying.

Another object of the present invention is to provide ink-jet printing ink for forming a uniform organic semiconductor layer after drying.

Still another object of the present invention is to provide an ink-jet printing ink composition for forming a uniform organic semiconductor layer having crystallinity after drying.

Still another object of the present invention is to provide a novel organic semiconductor transistor.

Technical Solution

In order to accomplish the above objects, the present invention provides a printing method, including: mixing a first solvent with a second solvent having a higher boiling point and lower surface tension than the first solvent to form a mixed solvent; dissolving an organic semiconductor in the mixed solvent to form a mixed solution; and dropping the mixed solution on a substrate and then drying the dropped mixed solution.

Although not theoretically limited, generally, a solute circumferentially moves because droplets are volatilized from their center to their circumference during a drying process. In this case, when a second solvent having a higher boiling point and lower surface tension than a first solvent is used, the surface tension gradient occurs between the center of the droplets and the circumference thereof, so that Marangoni flow is caused in a direction from the circumference having low surface tension toward the center having high surface tension, thus forming a uniformly-distributed thin film after drying.

In the present invention, the first solvent is not particularly limited as long as it can be used as a solvent for ink-jet printing. The first solvent may include water, an organic solvent and mixtures thereof. The organic solvent may be selected from among chlorobenzene, dichlorobenzene, trichlorobenzene, toluene, xylene, tetralin, decalin, octane, decane, dodecane, anisole, ethanol, isopropyl, and mixtures thereof.

The first solvent may have a boiling point of 100° C. or more, a surface tension of 20 mJ/m or more and a viscosity of 3~20 mPa·s, and, most preferably, may be chlorobenzene.

In the present invention, it is preferred that the difference in boiling point between the first solvent and the second solvent be 10~100° C. and that the difference in surface tension therebetween be 5 dyn/cm or more. Dodecane is preferably used as the second solvent.

The second solvent is used as an auxiliary solvent of the first solvent. In order to obtain a uniformly-dispersed thin film, it is preferred that the second solvent be used such that the volume ratio thereof is 1~50 vol %, preferably, 5~40 vol %.

In the present invention, the organic semiconductor may be a low-molecular organic semiconductor, preferably, pentacene such that it has crystallinity after drying. The pentacene may be 6,13-bis(triisopropylsilylethynyl)pentacene.

In an aspect, the present invention provides a circular thin film, prepared by dissolving various organic materials, such as an organic semiconductor, an organic insulator, an organic electrode material and the like, in a mixed solvent including a first solvent and a second solvent having a higher boiling point and lower surface tension than the first solvent to form a mixed solution, ink-jet-printing the mixed solution and then drying the ink-jet-printed mixed solution.

Here, in order to control the solute distribution of the droplets dropped on a substrate and then dried, an auxiliary solvent having a different boiling point and surface tension is added to the solution.

The auxiliary solvent is used to control the distribution of the solute in the solution. When the auxiliary solvent has a higher boiling point and lower surface tension than a main solvent, the solute is uniformly distributed throughout the circular thin film after drying. In contrast, when the auxiliary solvent has a lower boiling point and higher surface tension than the main solvent, the flow of the solution toward the circumference of the substrate is further strengthened by the surface tension gradient, thus increasing the thickness of the circumference of the thin film after drying.

After drying, the distribution of the solute in droplets can be controlled by the difference in boiling point or surface tension between the main solvent and the auxiliary solvent. In order to obtain the uniform distribution of the solute in droplets, it is preferred that the difference in boiling point between the main solvent and the auxiliary solvent be 10~100° C. and that the difference in surface tension between the main solvent and the auxiliary solvent be 5 dyne/cm or more.

In an aspect, the present invention provides an organic thin film transistor, including: source and drain electrodes formed on a substrate; a circular organic semiconductor layer which is brought into contact with the source and drain electrodes and which is ink-jet-printed with an organic semiconductor solution, wherein a circular gap is formed between the source and drain electrodes; a gate electrode disposed on or beneath the source and drain electrodes; and a gate insulation film isolating the gate electrode from the source and drain electrodes.

In the present invention, the circular gap formed between the source and drain electrodes, although not limited theoretically, serves to efficiently use the crystallinity occurring in a direction from the circumference of droplets toward the center of droplets after drying because an organic semiconductor is self-assembled from the circumference of droplets toward the center of droplets while forming the circular organic semiconductor layer by drying the ink-jet-printed droplets.

In the organic thin film transistor of the present invention, the drain electrode is circularly formed at the center of the circular organic semiconductor layer, the source electrode is circularly formed at the circumference of the circular organic semiconductor layer, and the circular gap is formed between the source and drain electrodes. In this case, the position of the source electrode may be changed with that of the drain electrode.

In the present invention, the ink-jet-printed organic semiconductor solution may be prepared by dissolving an organic semiconductor in a mixed solvent including a first solvent and a second solvent having a higher boiling point and lower surface tension than the first solvent such that the organic semiconductor is self-assembled from the circumference of droplets toward the center of droplets.

In the present invention, the first solvent can be used as a solvent for ink-jet printing. The first solvent may include water, an organic solvent and mixtures thereof. The organic solvent may be selected from among chlorobenzene, dichlorobenzene, trichlorobenzene, toluene, xylene, tetralin, decalin, octane, decane, dodecane, anisole, ethanol, isopropyl, and mixtures thereof. The first solvent may have a boiling point of 100° C. or more, a surface tension of 20 mJ/m or more and a viscosity of 3~20 mPa·s, and, most preferably, may be chlorobenzene.

In the present invention, the second solvent is an auxiliary solvent which is mixed with the first solvent. It is preferred that the difference in boiling point between the first solvent and the second solvent be 10~100° C. and that the difference in surface tension therebetween be 5 dyn/cm or more.

In the present invention, it is preferred that the mixed solvent be a combination of dichlorobenzene and dodecane.

The organic semiconductor layer is formed using an ink-jet printing method. When the organic semiconductor layer is formed using the ink-jet printing method, it is easy to inject a small amount of organic droplets at a desired position. That is, the injection amount and injection rate of the ink-jet printing ink required to fill up the circular gap between the source and drain electrodes and to form a circular organic semiconductor layer having a predetermined diameter on the source and drain electrodes can be experimentally determined.

In the present invention, the organic semiconductor layer may be composed of a low-molecular organic semiconductor selected from among pentacene such as 6,3-bis(triisopropylsilylethynyl)pentacene, tetracene, anthracene, naphthalene, alph-6-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, and the like. Preferably, the organic semiconductor layer may be composed of pentacene, most preferably, 6,3-bis(triisopropylsilylethynyl)pentacene.

In the present invention, a source electrode, a drain electrode, a gate and an insulator constituting a transistor may be manufactured using conventional transistor manufacturing methods.

In an aspect, the present invention provides a method of manufacturing an organic thin film transistor, comprising the steps of: providing a substrate; forming a gate on the substrate; forming a gate insulation film on the gate; forming source and drain electrodes on the gate insulation film; and connecting the source and drain electrodes by ink-jet-printing an organic semiconductor solution including a first solvent and a second solvent having a higher boiling point and lower surface tension than the first solvent therebetween.

In the present invention, the source and drain electrodes are concentrically formed into circular electrodes, and are connected with each other through an organic semiconductor thin film. A semiconductor solution for ink-jet printing is prepared by dissolving 1~2 wt % of 6,3-bis(triisopropylsilylethynyl) pentacene in a mixed solvent including chlorobenzene, serving as a main solvent, and deodecane, serving as an auxiliary solvent.

In an aspect, the present invention provides ink-jet printing ink in which an organic semiconductor is dissolved in a mixed solvent including a first solvent and a second solvent having a higher boiling point and lower surface tension than the first solvent.

In the ink-jet printing ink of the present invention, the mixed solvent may include 50~90 vol % of chlorobenzene and 10~50 vol % of dodecane, preferably, 70~80 vol % of chlorobenzene and 20~30 vol % of dodecane.

The ink-jet printing ink of the present invention is dropped using an ink-jet printer, and is used to prepare a semiconductive or charge-transporting material, element or device, and is also used to manufacture an optical, electrooptical or electronic device, field effect transistor (FET), integrated circuit (IC), thin film transistor (TFT) or organic light emitting diode (OLED) obtained from the semiconductive or charge-transporting material, element or device.

Further, the ink-jet printing ink of the present invention may be used to manufacture a thin film transistor (TFT) for flat displays, TFT array, radio frequency identification tag, electroluminescence display, backlight, semiconductive or charge-transporting material, element or device, field effect transistor (FET), integrated circuit (IC), thin film transistor (TFT) or organic light emitting diode (OLED).

In an aspect, the present invention provides a circular organic semiconductor thin film having crystallinity in a direction from a circumference of a circle toward a center thereof.

Advantageous Effects

According to the present invention, nonuniform thin film morphologies and low charge mobility occurring when an organic semiconductor is ink-jet printed using a single solvent was overcome. Thus, the present invention provides an organic thin film transistor exhibiting uniform thin film morphologies and high charge mobility.

Further, the present invention provides a circular transistor which can effectively use a circular ink-jet organic semiconductor thin film.

BEST MODE

The present invention provides a printing method, including: mixing a first solvent with a second solvent having a higher boiling point and lower surface tension than the first solvent to form a mixed solvent; dissolving an organic semiconductor in the mixed solvent to form a mixed solution; and dropping the mixed solution on a substrate and then drying the dropped mixed solution.

In the printing method of the present invention, the first solvent is not particularly limited as long as it can be used as a solvent for ink-jet printing. The first solvent may include water, an organic solvent and mixtures thereof. The organic solvent may be selected from among chlorobenzene, dichlorobenzene, trichlorobenzene, toluene, xylene, tetralin, decalin, octane, decane, dodecane, anisole, ethanol, isopropyl, and mixtures thereof.

The first solvent may have a boiling point of 100° C. or more, a surface tension of 20 mJ/m or more and a viscosity of 3~20 mPa·s, and, most preferably, may be chlorobenzene.

It is preferred that the difference in boiling point between the first solvent and the second solvent be 10~100° C. and that the difference in surface tension therebetween be 5 dyn/cm or more. Dodecane is preferably used as the second solvent.

The second solvent is used as an auxiliary solvent of the first solvent. In order to obtain a uniformly-dispersed thin film, it is preferred that the second solvent be used such that the volume ratio thereof is 1~50 vol %, preferably, 5~40 vol %.

The organic semiconductor may be a low-molecular organic semiconductor, preferably, pentacene such that it has crystallinity after drying. The pentacene may be 6,13-bis(triisopropylsilylethynyl)pentacene.

Further, the present invention provides a circular thin film, prepared by dissolving various organic materials, such as an organic semiconductor, an organic insulator, an organic electrode material and the like, in a mixed solvent including a first solvent and a second solvent having a higher boiling point and lower surface tension than the first solvent to form a mixed solution, ink-jet-printing the mixed solution and then drying the ink-jet-printed mixed solution.

Here, in order to control the solute distribution of the droplets dropped on a substrate and then dried, an auxiliary solvent having a different boiling point and surface tension is added to the solution.

Further, the present invention provides an organic thin film transistor, including: source and drain electrodes formed on a substrate; a circular organic semiconductor layer which is brought into contact with the source and drain electrodes and which is ink-jet-printed with an organic semiconductor solution, wherein a circular gap is formed between the source and drain electrodes; a gate electrode disposed on or beneath the source and drain electrodes; and a gate insulation film isolating the gate electrode from the source and drain electrodes.

In the organic thin film transistor of the present invention, the circular gap formed between the source and drain electrodes, although not limited theoretically, serves to efficiently use the crystallinity occurring in a direction from the circumference of droplets toward the center of droplets after drying because an organic semiconductor is self-assembled from the circumference of droplets toward the center of droplets while forming the circular organic semiconductor layer by drying the ink-jet-printed droplets.

In the organic thin film transistor of the present invention, the drain electrode is circularly formed at the center of the circular organic semiconductor layer, the source electrode is circularly formed at the circumference of the circular organic semiconductor layer, and the circular gap is formed between the source and drain electrodes. In this case, the position of the source electrode may be changed with that of the drain electrode.

In the present invention, the ink-jet-printed organic semiconductor solution may be prepared by dissolving an organic semiconductor in a mixed solvent including a first solvent and a second solvent having a higher boiling point and lower surface tension than the first solvent such that the organic semiconductor is self-assembled from the circumference of droplets toward the center of droplets.

In the present invention, the first solvent can be used as a solvent for ink-jet printing. The first solvent may include water, an organic solvent and mixtures thereof. The organic solvent may be selected from among chlorobenzene, dichlorobenzene, trichlorobenzene, toluene, xylene, tetralin, decalin, octane, decane, dodecane, anisole, ethanol, isopropyl, and mixtures thereof. The first solvent may have a boiling point of 100° C. or more, a surface tension of 20 mJ/m or more and a viscosity of 3~20 mPa·s, and, most preferably, may be chlorobenzene.

In the present invention, the second solvent is an auxiliary mixed with the first solvent. It is preferred that the difference in boiling point between the first solvent and the second solvent be 10~100° C. and that the difference in surface tension therebetween be 5 dyn/cm or more.

In the present invention, it is preferred that the mixed solvent be a combination of dichlorobenzene and dodecane.

In the present invention, the organic semiconductor layer may be composed of a low-molecular organic semiconductor selected from among pentacene such as 6,3-bis(triisopropylsilylethynyl)pentacene, tetracene, anthracene, naphthalene, alph-6-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, and the like. Preferably, the organic semiconductor layer may be composed of pentacene, most preferably, 6,3-bis(triisopropylsilylethynyl)pentacene.

In the present invention, a source electrode, a drain electrode, a gate and an insulator constituting a transistor may be manufactured using conventional transistor manufacturing methods.

Further, the present invention provides a method of manufacturing an organic thin film transistor, comprising the steps of: providing a substrate; forming a gate on the substrate; forming a gate insulation film on the gate; forming source and drain electrodes on the gate insulation film; and connecting the source and drain electrodes by ink-jet-printing an organic semiconductor solution including a first solvent and a second solvent having a higher boiling point and lower surface tension than the first solvent therebetween.

In the method of manufacturing an organic thin film transistor, the source and drain electrodes are concentrically formed into circular electrodes, and are connected with each other through an organic semiconductor thin film. A semiconductor solution for ink-jet printing is prepared by dissolving 1~2 wt % of 6,3-bis(triisopropylsilylethynyl)pentacene in a mixed solvent including chlorobenzene, serving as a main solvent, and deodecane, serving as an auxiliary solvent.

Furthermore, the present invention provides an ink-jet printing ink in which an organic semiconductor is dissolved in a mixed solvent including a first solvent and a second solvent having a higher boiling point and lower surface tension than the first solvent.

In the ink-jet printing ink of the present invention, the mixed solvent may include 50~90 vol % of chlorobenzene and 10~50 vol % of dodecane, preferably, 70~80 vol % of chlorobenzene and 20~30 vol % of dodecane.

Mode for Invention

EXAMPLES

First, the properties of a mixed solvent, in which chlorobenzene was mixed with 25 vol % of hexane, o-dichlorobenzene or dodecane, were measured, and the results thereof are given in Table 1.

TABLE 1

| Solvent | Main solvent | Auxiliary solvent (25 vol %) | | |
|---|---|---|---|---|
| Properties | chlorobenzene | hexane | o-dichlorobenzene | dodecane |
| Boiling point [° C.] | 131.1 | 68.8 | 180 | 216 |
| Surface tension [dyn/cm] | 33.6 | 18.4 | 36.6 | 25.3 |
| Vapor pressure at 27° C. [kPa] | 1.8 | 22.1 | 0.2 | 0.02 |

Example 1

1~2 wt % of 6,13-bis(triisopropylsilylethynyl)pentancane was dissolved in a mixed solvent of chlorobenzene and dodecane (75:25 by vol %) to prepare a mixed solution. The mixed solution was printed on a $SiO_2$ substrate treated with 1,1,1,3,3,3-hexamethyldisilazane (HMDS). The mixed solution was printed using an ink-jet printer equipped with a CCD camera including a single-nozzle drop-on-demand piezoelectric print head (Microfab Jet Drive III), a biaxial motor alignment system and an LED for capturing the injection of droplets. One droplet having a volume of 40~50 pL was injected through the nozzle having a diameter of 80 μm. Generally, the vertical distance between the nozzle and the substrate was 0.5 mm.

Example 2

Example 2 was performed as in Example 1, except that a mixed solvent of chlorobenzene and o-dichlorobenzene was used.

Example 3

Example 3 was performed as in Example 1, except that a mixed solvent of chlorobenzene and dodecane (90:10 by vol %) was used.

Example 4

Example 4 was performed as in Example 1, except that a mixed solvent of chlorobenzene and dodecane (50:50 by vol %) was used.

Comparative Example 1

Comparative Example 1 was performed as in Example 1, except that a mixed solvent of chlorobenzene and hexane was used.

Comparative Example 2

Comparative Example 2 was performed as in Example 1, except that a single solvent of chlorobenzene was used.

Manufacture of an Organic Field Effect Transistor (OFET)

Example 5

An organic field effect transistor (OFET) having a bottom-contact structure was manufactured using a gate electrode including a $SiO_2$ layer (capacitance=10.8 $nFcm^{-2}$) which was thermally oxidized with a gate dielectric and had a thickness of 30 nm and using an n-type Si wafer. The $SiO_2$ layer was surface-treated with HMDS before the deposition of a primer electrode. Gold source and drain electrodes were fabricated in the form of a close-ring using general photolithography. A titanium layer having a thickness of 3 nm was used to attach the gold electrodes. The surface of the gold electrodes was treated with dodecanethiol in order to match channel regions and surface energy. TIPS_PEN, which is an organic semiconductor, was dissolved in a mixed solvent of chlorobenzene and dodecane (75:25 by vol %) to form a mixed solution, and the mixed solution including TIPS_PEN was printed. TIPS_PEN was printed on electrodes selectively patterned using an alignment system of an ink-jet printer.

The average mobility and ON/OFF electrode ratio of the OFET were measured.

Example 6

Example 6 was performed as in Example 5, except that TIPS_PEN was dissolved in a solvent.

Comparative Example 3

Comparative Example 3 was performed as in Example 5, except that TIPS_PEN was dissolved in a mixed solvent of chlorobenzene and hexane (75:25 by vol %).

Comparative Example 4

Comparative Example 4 was performed as in Example 5, except that TIPS_PEN was dissolved in chlorobenzene.

Figure 1:
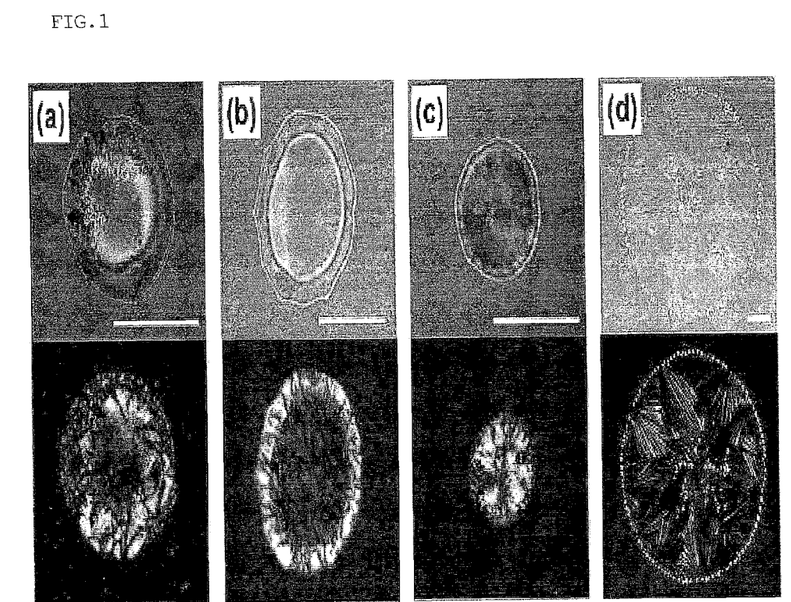
FIG. 1 shows the optical microscope images and polarized images of ink-jet-printed TIPS_PEN droplets when the composition of a solvent was varied, i.e., (a) when using chlorobenzene as a solvent, (b) when using a mixture of chlorobenzene and hexane (25 vol %) as a solvent, (c) when using a mixture of chlorobenzene and o-dichlorobenzene (25 vol %) as a solvent, and (d) when using a mixture of chlorobenzene and dodecane (25 vol %) as a solvent.
Figure 2:
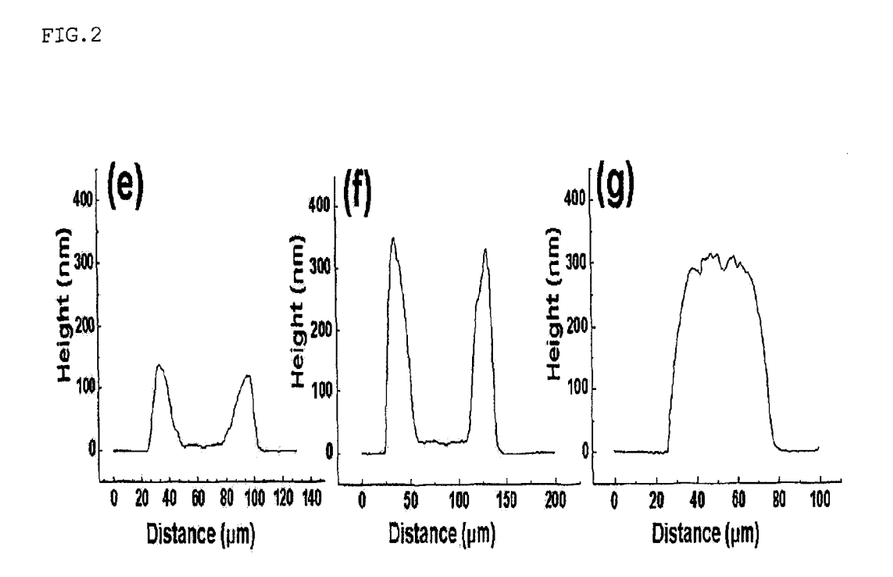
FIG. 2 shows the height profiles of ink-jet-printed TIPS_PEN droplets when the composition of a solvent was varied, i.e., (e) when using chlorobenzene as a solvent, (f) when using a mixture of chlorobenzene and hexane (25 vol %) as a solvent, and (g) when using a mixture of chlorobenzene and o-dichlorobenzene (25 vol %) as a solvent.
Figure 3:
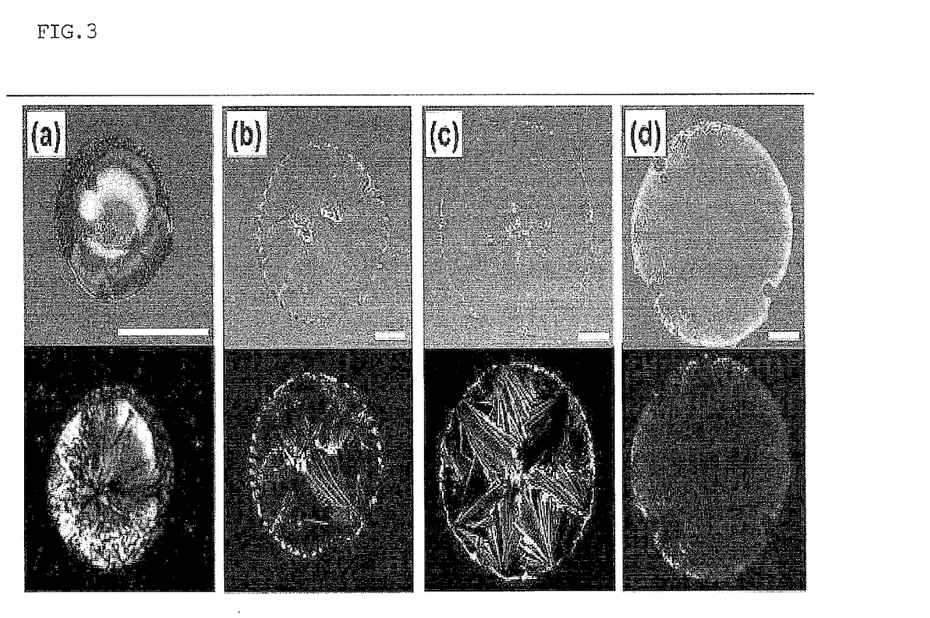
FIG. 3 shows the optical microscope images of ink-jet-printed TIPS_PEN droplets when the mixing ratio of dodecane to chlorobenzene in a solvent was varied, i.e., (a) when the mixing ratio is 0 vol % (that is, when a solvent is composed of only chlorobenzene), (b) when the mixing ratio is 10 vol %, (c) when the mixing ratio is 25 vol %, and (d) when the mixing ratio is 50 vol %.
Figure 4:
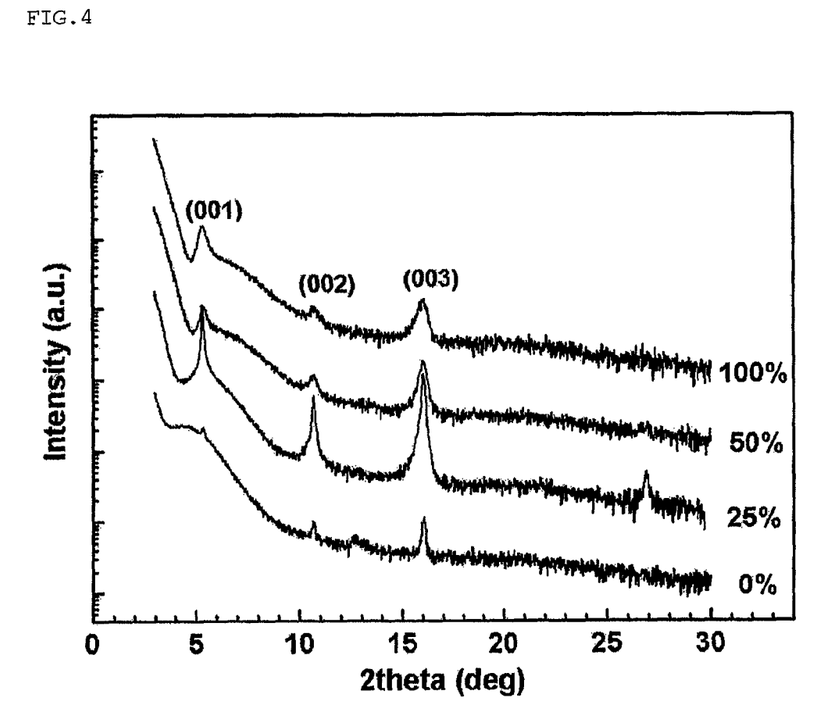
FIG. 4 shows the X-ray diffraction patterns of ink-jet-printed TIPS_PEN droplets when the mixing ratio of dodecane to chlorobenzene in a solvent was varied.
Figure 5:
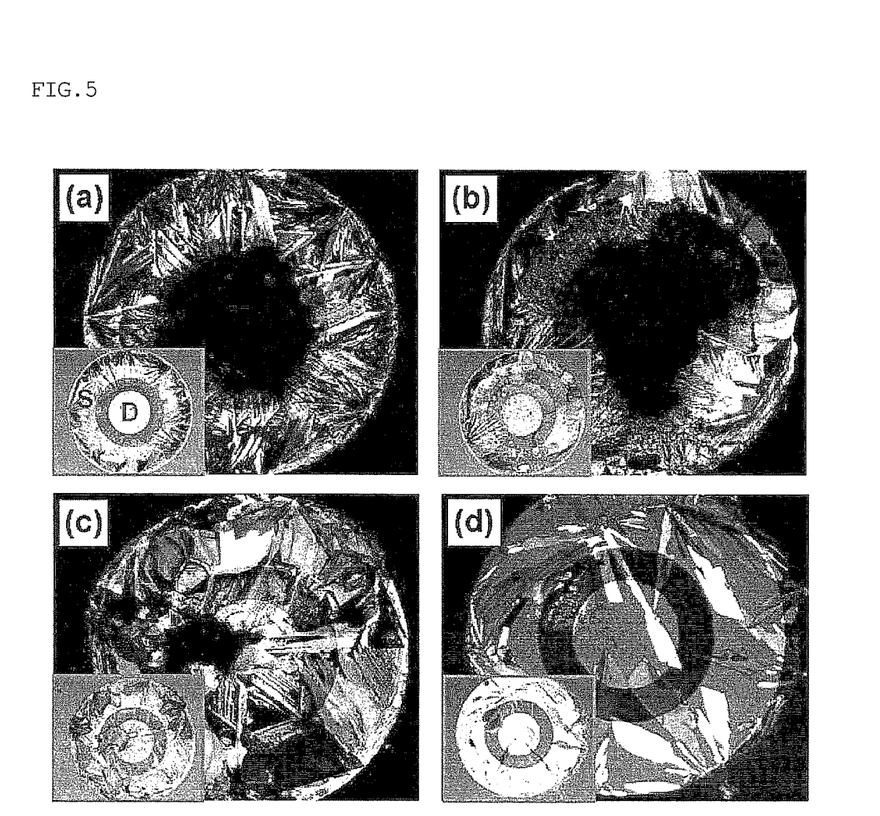
FIG. 5 shows the optical microscope images and polarized images of devices which were ink-jet-printed with TIPS_PEN droplets when the composition of a solvent was varied, i.e., (a) when using chlorobenzene as a solvent, (b) when using a mixture of chlorobenzene and hexane (25 vol %) as a solvent, (c) when using a mixture of chlorobenzene and o-dichlorobenzene (25 vol %) as a solvent, and (d) when using a mixture of chlorobenzene and dodecane (25 vol %) as a solvent.
Figure 6:
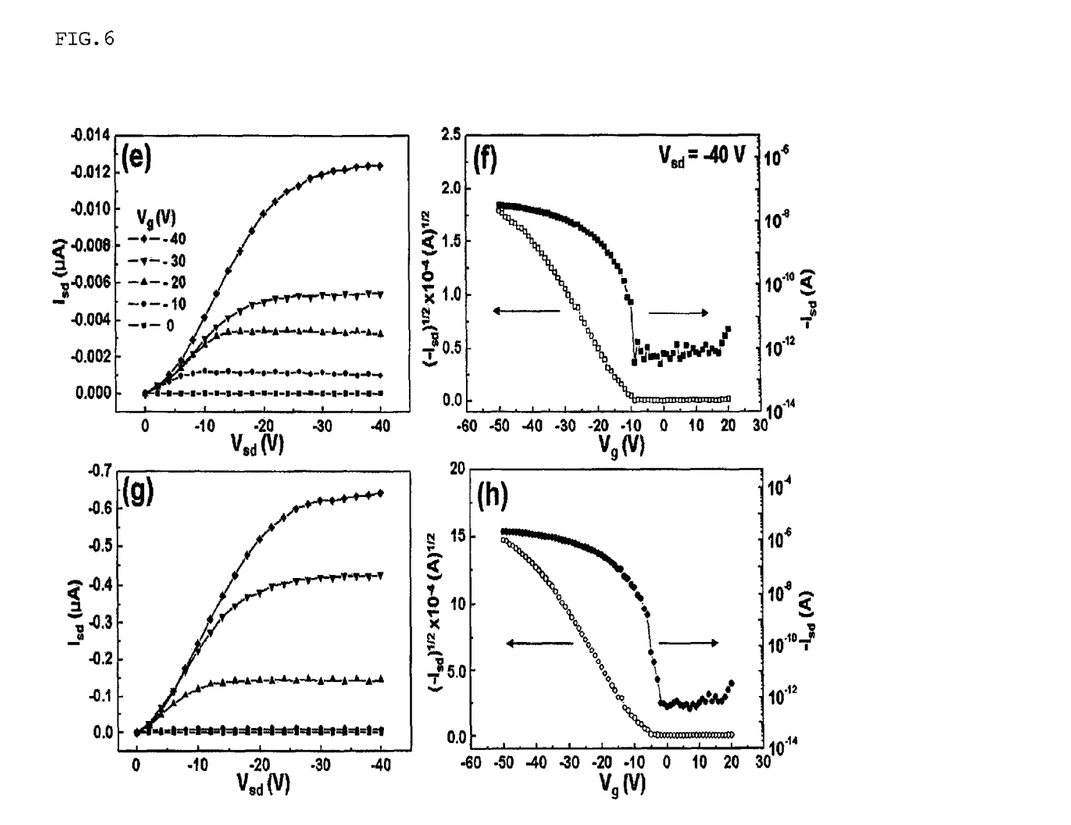
FIG. 6 shows the characteristics of devices which were ink-jet-printed with TIPS_PEN droplets when the composition of a solvent was varied, i.e., (a) when using chlorobenzene as a solvent, (b) when using a mixture of chlorobenzene and hexane (25 vol %) as a solvent, (c) when using a mixture of chlorobenzene and o-dichlorobenzene (25 vol %) as a solvent, and (d) when using a mixture of chlorobenzene and dodecane (25 vol %) as a solvent.

The average mobility and ON/OFF electrode ratios thereof are given in Table 2. The photographs and results thereof are shown in FIGS. 4 and 5.

TABLE 2

| Solvent composition | Average mobility [$cm^2s^{-1}v^{-1}$] | ON/OFF electrode ratio |
|---|---|---|
| chlorobenzene | $2.52 \times 10^{-4}$ | $10^4$ |
| +hexane | $1.18 \times 10^{-3}$ | $10^4$ |
| +dichlorobenzene | 0.010 | $10^6$ |
| +dodecane | 0.018 | $10^6$ |

INDUSTRIAL APPLICABILITY

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:
1. A printing method, comprising:
mixing a main solvent with 5~40 vol. % of an auxiliary solvent having a higher boiling point and lower surface tension than the main solvent to form a mixed solvent, wherein the vol. % is based on the total volume of the mixed solvent;
dissolving an organic semiconductor in the mixed solvent to form a mixed solution;
dropping the mixed solution on a substrate; and
drying the mixed solution,
thereby forming a uniform circular organic semiconductor layer having crystalline structures in a direction from a circumference of the circle toward a center thereof.
2. The printing method according to claim 1, wherein the main solvent has a boiling point of 100° C. or more and a surface tension of 20 mJ/m or more.
3. The printing method according to claim 1, wherein the main solvent is any one selected from the group consisting of water, chlorobenzene, dichlorobenzene, trichlorobenzene, toluene, xylene, tetralin, decalin, octane, decane, dodecane, anisole, ethanol, isopropyl, and mixtures thereof.
4. The printing method according to claim 1, wherein a difference in boiling point between the main solvent and the auxiliary solvent is 10~100° C.

5. The printing method according to claim 1, wherein a difference in surface tension between the main solvent and the auxiliary solvent is 5 dyn/cm or more.

6. The printing method according to claim 1, wherein the organic semiconductor is a low-molecular organic semiconductor.

7. The printing method according to claim 1, wherein the mixed solution including the organic semiconductor is dropped using an ink-jet printing method.

8. The printing method according to claim 1, wherein the main solvent is chlorobenzene, and the auxiliary solvent is dodecane.

9. The printing method according to claim 8, wherein the organic semiconductor is 6,13-bis(triisopropylsilylethynyl) pentacene.

* * * * *